(12) United States Patent
Chen et al.

(10) Patent No.: US 11,323,125 B2
(45) Date of Patent: May 3, 2022

(54) TRANSCEIVER CIRCUIT AND SELF-CALIBRATION METHOD

(71) Applicant: Realtek Semiconductor Corporation, Hsinchu (TW)

(72) Inventors: Beng-Meng Chen, Hsinchu (TW); Chien-Jung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/200,011

(22) Filed: Mar. 12, 2021

(65) Prior Publication Data

US 2022/0085819 A1 Mar. 17, 2022

(30) Foreign Application Priority Data

Sep. 15, 2020 (TW) .................................. 109131613

(51) Int. Cl.
*H03L 7/099* (2006.01)
*H03L 7/093* (2006.01)
(Continued)

(52) U.S. Cl.
CPC ......... *H03L 7/099* (2013.01); *H03K 5/00006* (2013.01); *H03K 5/24* (2013.01);
(Continued)

(58) Field of Classification Search
CPC ....... H03L 7/099; H03L 7/18; H03L 2207/06; H03L 2207/50; H03L 7/0995; H03L 7/093; H03L 7/1075; H03L 7/20; H03K 5/24; H03K 2005/00071; H04B 1/406; H04B 1/40; H04L 7/033; H04L 7/0331
See application file for complete search history.

(56) References Cited

U.S. PATENT DOCUMENTS

2005/0079839 A1* 4/2005 Asayama .................. H03J 3/08
455/168.1
2007/0082644 A1* 4/2007 Ho ....................... H04B 1/0082
725/68

(Continued)

FOREIGN PATENT DOCUMENTS

TW 200915726 A 4/2009

*Primary Examiner* — Khanh C Tran
(74) *Attorney, Agent, or Firm* — Locke Lord LLP; Tim Tingkang Xia, Esq.

(57) ABSTRACT

A transceiver circuit is configured to couple an oscillation crystal. The transceiver circuit includes a local oscillator, a filter circuit, a control circuit, and a radio frequency signal generator circuit. The local oscillator includes a capacitive element. The local oscillator generates a phase locked loop signal based on an oscillation frequency of the oscillation crystal and a capacitance value of the capacitive element. The filter circuit generates a filtered signal according to the phase locked loop signal. The control circuit adjusts the capacitance value to be an adjusted capacitance value according to the filtered signal and the phase locked loop signal. The local oscillator further generates a calibrated local oscillation signal according to the oscillation frequency and the adjusted capacitance value. The radio frequency signal generator circuit generates a radio frequency signal according to the calibrated local oscillation signal and a baseband signal.

16 Claims, 4 Drawing Sheets

(51) Int. Cl.
*H04L 7/033* (2006.01)
*H03K 5/00* (2006.01)
*H04B 1/40* (2015.01)
*H03K 5/24* (2006.01)

(52) U.S. Cl.
CPC ............... *H03L 7/093* (2013.01); *H04B 1/40* (2013.01); *H04L 7/0331* (2013.01)

(56) References Cited

U.S. PATENT DOCUMENTS

| | | | |
|---|---|---|---|
| 2009/0322436 A1* | 12/2009 | Hosoya | H03L 7/099 331/117 FE |
| 2012/0139654 A1* | 6/2012 | Ohara | H03L 7/099 331/36 C |
| 2014/0024326 A1 | 1/2014 | Imai et al. | |
| 2021/0083624 A1* | 3/2021 | Urakawa | H03B 5/1228 |

* cited by examiner

TRANSCEIVER CIRCUIT AND SELF-CALIBRATION METHOD

RELATED APPLICATIONS

This application claims priority to Taiwanese Application Serial Number 109131613, filed Sep. 15, 2020, which is herein incorporated by reference.

BACKGROUND

Technical Field

The present disclosure relates to a calibration technology. More particularly, the present disclosure relates to a transceiver circuit and a self-calibration method for frequency offset calibrations.

Description of Related Art

With developments of communication technology, transceiver circuits of two electrical devices can transmit signals with each other by wireless communication. However, environment condition variations (e.g., temperature increases) can result in frequency offsets.

SUMMARY

Some aspects of the present disclosure are to provide a transceiver circuit. The transceiver circuit is configured to couple an oscillation crystal. The transceiver circuit includes a local oscillator, a filter circuit, a control circuit, and a radio frequency signal generator circuit. The local oscillator includes a capacitive element. The local oscillator is configured to generate a phase locked loop signal based on an oscillation frequency of the oscillation crystal and a capacitance value of the capacitive element. The filter circuit is configured to generate a filtered signal according to the phase locked loop signal. The control circuit is configured to adjust the capacitance value to be an adjusted capacitance value according to the filtered signal and the phase locked loop signal. The local oscillator is further configured to generate a calibrated local oscillation signal according to the oscillation frequency and the adjusted capacitance value. The radio frequency signal generator circuit is configured to generate a radio frequency signal according to the calibrated local oscillation signal and a baseband signal.

Some aspects of the present disclosure are to provide a self-calibration method. The self-calibration method includes following operations: generating, by a local oscillator, a phase locked loop signal based on an oscillation frequency of an oscillation crystal and a capacitance value of a capacitive element; generating, by a filter circuit, a filtered signal according to the phase locked loop signal; adjusting, by a control circuit, the capacitance value to be an adjusted capacitance value according to the filtered signal and the phase locked loop signal; generating, by the local oscillator, a calibrated local oscillation signal according to the oscillation frequency and the adjusted capacitance value; and generating, by a radio frequency signal generator circuit, a radio frequency signal according to the calibrated local oscillation signal and a baseband signal.

As described above, the transceiver circuit and the self-calibration method of the present disclosure can calibrate the frequency offsets fast and immediately, and the transceiver circuit and the self-calibration method of the present disclosure are suitable for different transceiver circuits and different oscillation crystals.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
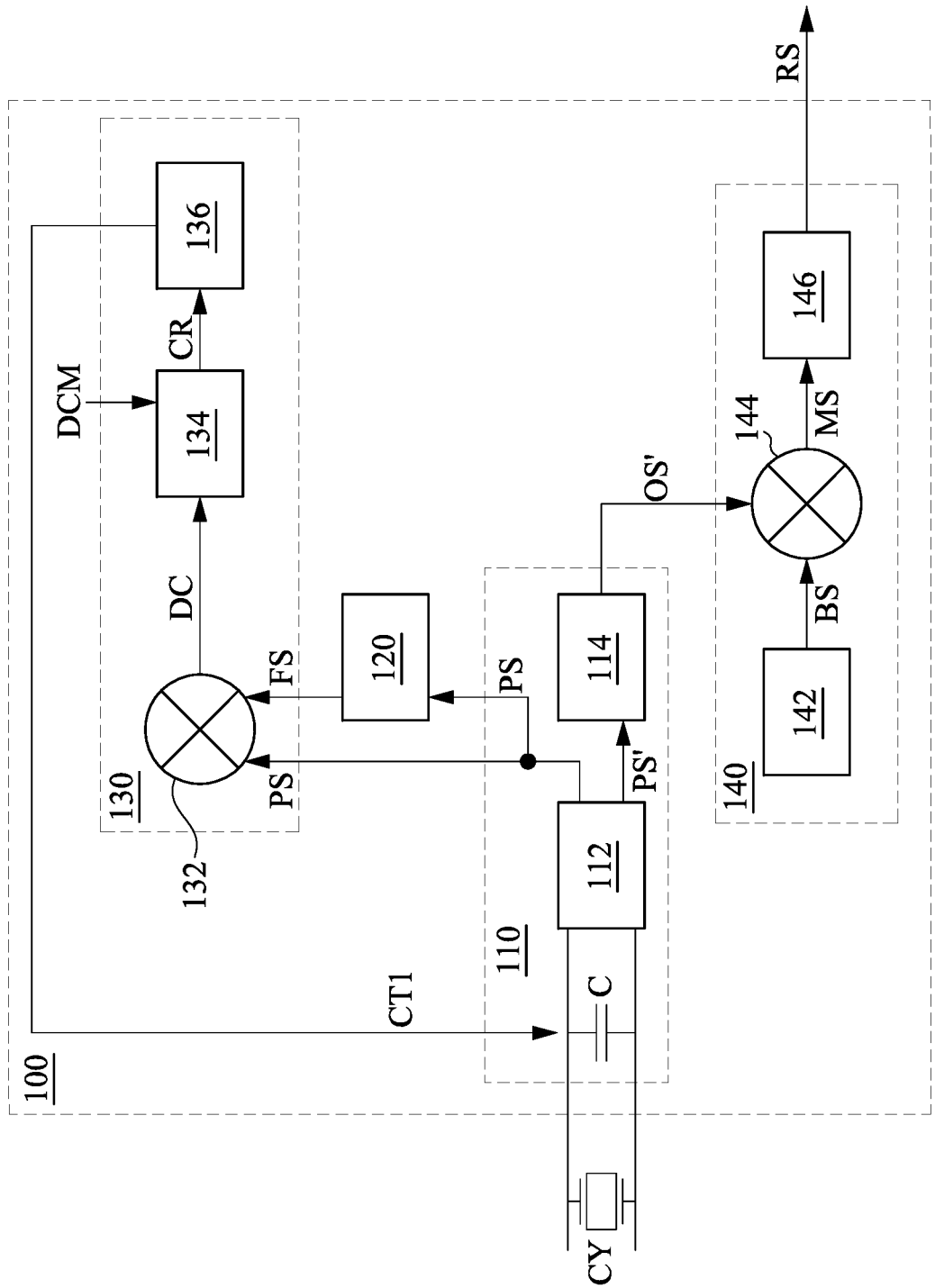
FIG. 1 is a schematic diagram of a transceiver circuit and an oscillation crystal according to some embodiments of the present disclosure.

Reference is made to FIG. 1. FIG. 1 is a schematic diagram of a transceiver circuit 100 and an oscillation crystal CY according to some embodiments of the present disclosure. The transceiver circuit 100 can be coupled to the oscillation crystal CY. The transceiver circuit 100 can be associated with the oscillation crystal CY to implement specific functions (e.g., to generate a radio frequency signal RS). In some embodiments, the transceiver circuit 100 may be implemented by a System on Chip (SoC) or a part of a SoC.

As illustrated in FIG. 1, the transceiver circuit 100 includes a local oscillator 110, a filter circuit 120, a control circuit 130, and a radio frequency signal generator circuit 140. The filter circuit 120 is coupled to the local oscillator 110. The control circuit 130 is coupled to the local oscillator 110 and the filter circuit 120. The radio frequency signal generator circuit 140 is coupled to the local oscillator 110.

As illustrated in FIG. 1, the local oscillator 110 includes a capacitive element C, a phase locked loop circuit 112, and a frequency divider 114. The phase locked loop circuit 112 is coupled to the oscillation crystal CY and the capacitive element C. The frequency divider 114 is coupled to the phase locked loop circuit 112. The phase locked loop circuit 112 can generate a phase locked loop signal PS based on an oscillation frequency of the oscillation crystal CY and a capacitance value of the capacitive element C. In some embodiments, environment condition variations can result in a frequency offset on the oscillation frequency of the oscillation crystal CY.

As illustrated in FIG. 1, the filter circuit 120 is coupled to the phase locked loop circuit 112 to receive the phase locked loop signal PS. The filter circuit 120 can generate a filtered signal FS according to the phase locked loop signal PS. In some embodiments, the filter circuit 120 is a band-pass filter. The band-pass filter may be implemented by a transmission line, but the present disclosure is not limited thereto.

Figure 2:
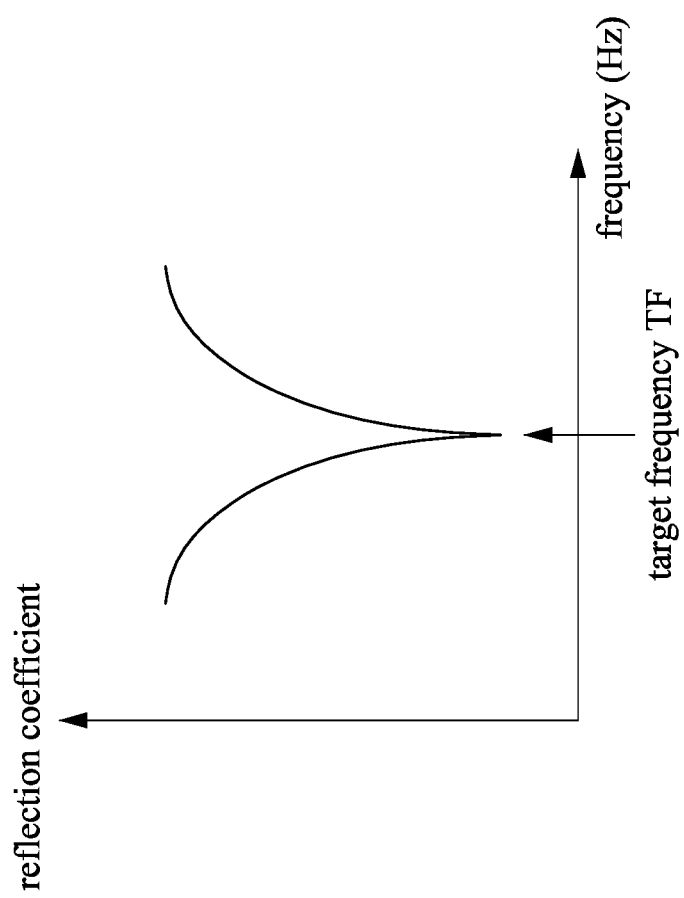
FIG. 2 is a frequency response diagram of a filter circuit in FIG. 1 according to some embodiments of the present disclosure.

Reference is made to FIG. 2. FIG. 2 is a frequency response diagram of the filter circuit 120 in FIG. 1 according to some embodiments of the present disclosure. A target frequency TF is "a frequency of the phase locked loop signal PS when the oscillation frequency of the oscillation crystal CY has no frequency offset." As illustrated in FIG. 2, the frequency response of the filter circuit 120 is ideally to have a lowest reflection coefficient at the target frequency TF (i.e., at the frequencies around the wave trough portion of the curve in FIG. 2). In other words, when the oscillation frequency of the oscillation crystal CY has no frequency offset, most of the components corresponding to the target frequency TF of the phase locked loop signal PS can pass through the filter circuit 120, and the rest of the components of the phase locked loop signal PS can be filtered out by the filter circuit 120.

It is noted that the filter circuit 120 has a characteristic insensitive to the environment condition variations (e.g., temperature increases). Thus, even if the environment condition variations truly result in the frequency offset on the oscillation frequency of the oscillation crystal CY, such variations can fail to impact the frequency response of the filter circuit 120.

Reference is made to FIG. 1 again. The control circuit 130 can adjust the capacitance value of the capacitive element C in the local oscillator 110 according to the filtered signal FS and the phase locked loop signal PS. For example, the control circuit 130 includes a frequency mixer 132, a comparator circuit 134 and a driver circuit 136.

The frequency mixer 132 is coupled to the filter circuit 120 and the phase locked loop circuit 112 to receive the filtered signal FS and the phase locked loop signal PS respectively. The frequency mixer 132 can perform a frequency mixing process on the filtered signal FS and the phase locked loop signal PS to generate a direct-current signal DC. When the oscillating frequency of the oscillation crystal CY has no frequency offset (i.e., the oscillating frequency of the oscillation crystal CY is substantially corresponding to the target frequency TF), the frequency of the phase locked loop signal PS has no frequency offset (i.e., the frequency of the phase locked loop signal PS is substantially corresponding to the target frequency TF). Since the frequency of the phase locked loop signal PS is corresponding to the target frequency TF, the phase locked loop signal PS can pass through the filter circuit 120 with no attenuation or slight attenuation (as the frequency response in FIG. 2). On the other hand, signal energy of the phase locked loop signal PS is barely attenuated since the phase locked loop signal PS is directly inputted into the frequency mixer 132, from the phase locked loop circuit 112, without passing through other electrical elements. The direct-current signal DC has a maximum direct-current voltage since the direct-current signal DC is generated by the frequency mixer 132 according to the filtered signal FS and the phase locked loop signal PS which have no attenuation or slight attenuation. A value corresponding to this maximum direct-current voltage may be stored in a storage circuit or a register in advance as a maximum direct-current voltage DCM.

On the contrary, when the variations of the environment conditions result in the frequency offset on the oscillation frequency of the oscillation crystal CY (i.e., the oscillating frequency of the oscillation crystal CY is substantially not corresponding to the target frequency TF), it results in a frequency offset on the frequency of the phase locked loop signal PS (i.e., the frequency of the phase locked loop signal PS is substantially not corresponding to the target frequency TF). Since the frequency of the phase locked loop signal PS is substantially not corresponding to the target frequency TF, most of the components (e.g. those parts that are not around the wave trough of the curve in FIG. 2 shows increasing reflection coefficients deviated from the target frequency TF) of the phase locked loop signal PS is filtered out by the filter circuit 120. In this manner, the signal energy of the filtered signal FS can be greatly attenuated. On the other hand, the signal energy of the phase locked loop signal PS is barely attenuated since the phase locked loop signal PS is directly inputted into the frequency mixer 132 from the phase locked loop circuit 112 without passing through other electrical elements. In this case, the direct-current signal DC cannot achieve the maximum direct-current voltage DCM since the direct-current signal DC is generated by the frequency mixer 132 according to the filtered signal FS which has a significant attenuation and the phase locked loop signal PS which has no attenuation or slight attenuation.

Based on the descriptions above, the comparator circuit 134 can compare the voltage of the direct-current signal DC with the maximum direct-current voltage DCM to generate a comparison result CR. The driver circuit 136 can generate a control signal CT1 according to the comparison result CR to adjust the capacitance value of the capacitive element C in the local oscillator 110. For example, if the comparison result CR indicates that the voltage of the direct-current signal DC is substantially equal to the maximum direct-current voltage DCM, it represents that the oscillation frequency of the oscillation crystal CY has no frequency offset. In this situation, a calibration of the phase locked loop signal PS is unnecessary. In other words, it is unnecessary to calibrate the capacitance value of the capacitive element C. If the comparison result CR indicates that the voltage of the direct-current signal DC is lower than the maximum direct-current voltage DCM (i.e. because the phase locked loop signal PS passes through the filter circuit 120 can generate attenuated filtered signal FS), it represents that the oscillation frequency of the oscillation crystal CY has a frequency offset. In this case, a calibration of the phase locked loop signal PS can be performed. In other words, the capacitance value of the capacitive element C can be adjusted accordingly.

In some embodiments, the driver circuit 136 can adjust the capacitance value of the capacitive element C. The adjusted capacitance values are corresponding to different direct-current voltages, and the maximum direct-current voltage DCM is the maximum one among these direct-current voltages. In some embodiments, the driver circuit 136 can adjust the capacitance value of the capacitive element C to be a capacitance value corresponding to the maximum direct-current voltage DCM. An approach that the control signal CT1 applies adjustment on the capacitance value of the capacitive element C is described with FIG. 3 in following paragraphs.

Then, the phase locked loop circuit 112 can generate a calibrated phase locked loop signal PS' according to the oscillation frequency of the oscillation crystal CY and the adjusted capacitance value. The frequency divider 114 can perform a frequency dividing process on the calibrated phase locked loop signal PS' to generate a calibrated local oscillation signal OS'.

The radio frequency signal generator circuit 140 can generate the radio frequency signal RS according to the calibrated local oscillation signal OS' and a baseband signal BS. For example, the radio frequency signal generator circuit 140 includes a baseband circuit 142, a frequency mixer 144, and a radio frequency circuit 146. The frequency mixer 144 is coupled to the frequency divider 114 and the baseband circuit 142 so that the frequency mixer 144 can receive the calibrated local oscillation signal OS' and the baseband signal BS respectively. The frequency mixer 144 can perform a frequency mixing process on the calibrated local oscillation signal OS' and the baseband signal BS to generate a frequency mixing signal MS. The radio frequency circuit 146 is coupled to the frequency mixer 144 to receive the frequency mixing signal MS. The radio frequency circuit 146 can generate the radio frequency signal RS according to the frequency mixing signal MS.

Figure 3:
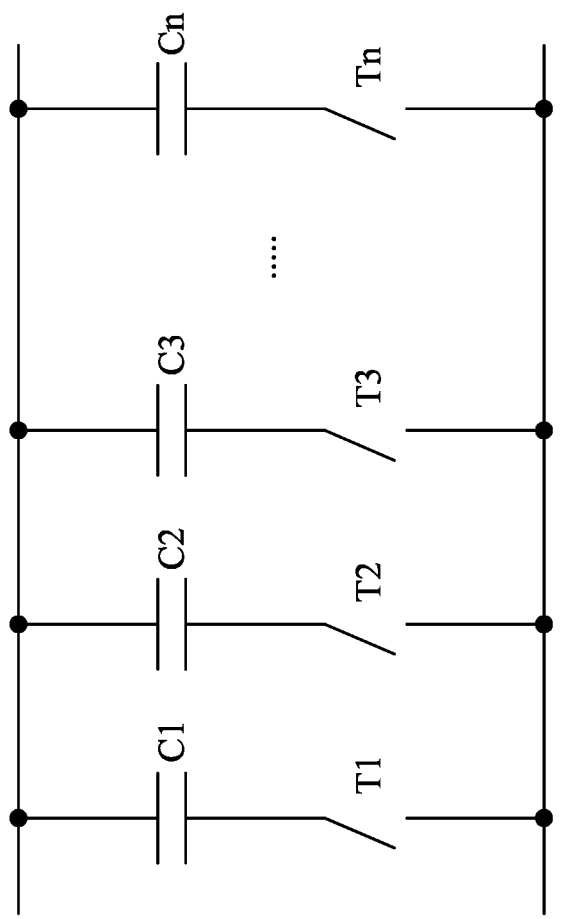
FIG. 3 is a circuit diagram of a capacitive element according to some embodiments of the present disclosure.

Reference is made to FIG. 3. FIG. 3 is a circuit diagram of the capacitive element C according to some embodiments of the present disclosure. In some embodiments, the capacitive element C in the local oscillator 110 can be implemented by a switched capacitor array so the capacitance value of the capacitive element C can be adjusted dynamically. For example, the control signal CT1 is corresponding to a specific cap index. When the cap index increases, it decreases the capacitance value of the capacitive element C and increases the frequency of the calibrated phase locked loop signal PS' When the cap index decreases, it increases the capacitance value of the capacitive element C and decreases the frequency of the calibrated phase locked loop signal PS'.

As illustrated in FIG. 3, the capacitive element C includes capacitors C1-Cn and switches T1-Tn. The control signal CT1 generated by the driver circuit 136 in FIG. 1 can be configured to control the switches T1-Tn to be turned on or off so as to adjust the capacitance value of the capacitive element C.

The implementation of the capacitive element C in FIG. 3 is only for exemplary purpose, and the present disclosure is not limited thereto. Various implementations (e.g., various quantities of capacitors, various quantities of switches, or various coupling structure) of the capacitive element C are within the contemplated scopes of the present disclosure.

In some related arts, it requires a temperature sensor in the system and a time-consuming preset look-up table to establish capacitance adjustments corresponding to various temperatures. Then, the sensed temperature is transmitted back to a driver circuit and the driver circuit performs a calibration process with the look-up table. Such non-real-time calibration method can be time-consuming. Moreover, a single look-up table may be not suitable for various transceiver circuits or various oscillation crystals because of product yield and applicability (e.g., different vendor specifications or different adjustments) of the oscillation crystals.

Compared to the aforementioned related arts, the transceiver circuit 100 of the present disclosure requires no look-up table and the calibration process can be performed fast and immediately. In addition, the transceiver circuit 100 of the present disclosure has the self-calibration mechanism which is suitable for various transceiver circuits or various oscillation crystals.

Figure 4:
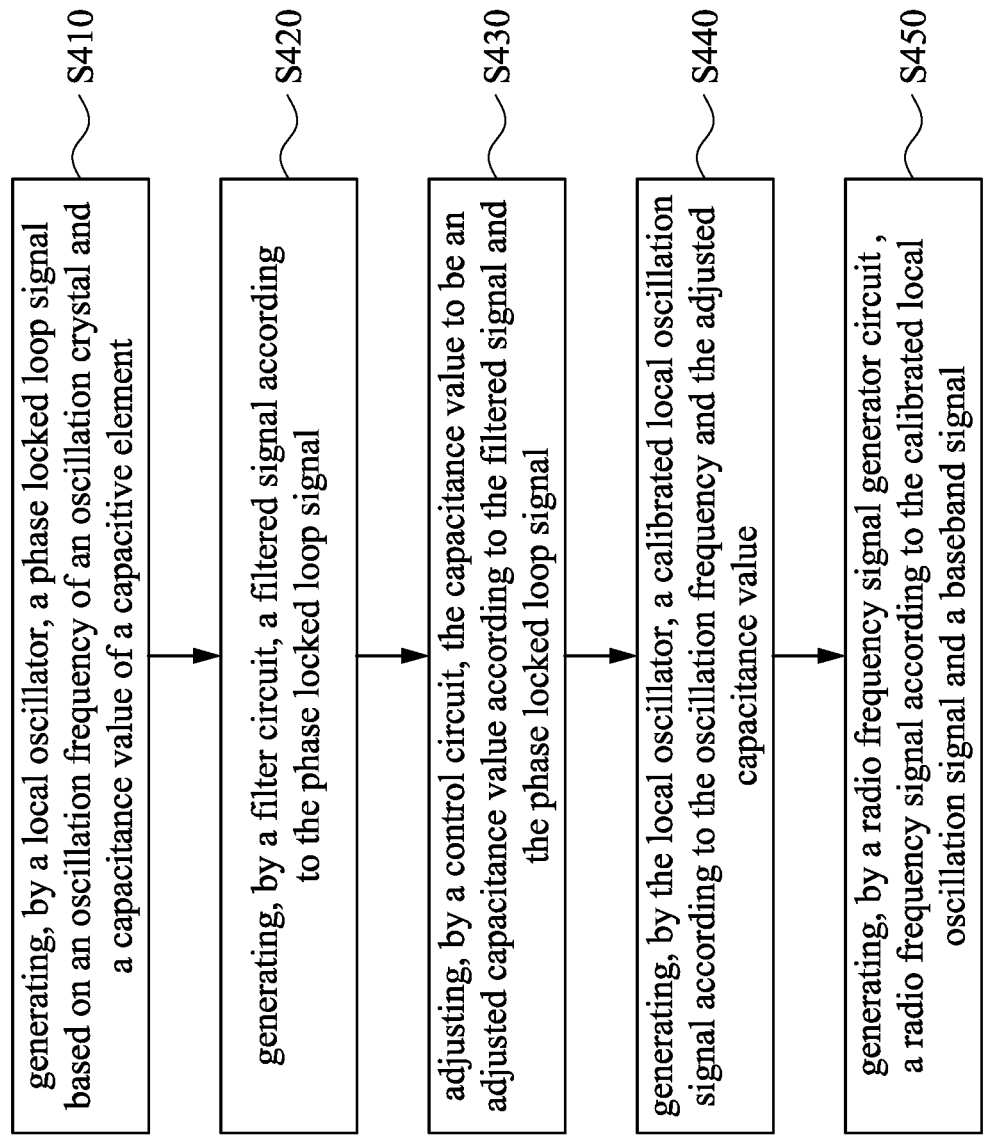
FIG. 4 is a flow diagram of a self-calibration method according to some embodiments of the present disclosure.

Reference is made to FIG. 4. FIG. 4 is a flow diagram of a self-calibration method 400 according to some embodiments of the present disclosure. In some embodiments, the self-calibration method 400 is implemented to the transceiver circuit 100 in FIG. 1, but the present disclosure is not limited thereto. The self-calibration method 400 includes operations S410, S420, S430, S440, and S450.

In operation S410, the local oscillator 110 generates the phase locked loop signal PS based on the oscillating frequency of the oscillation crystal CY and the capacitance value of the capacitive element C. In some embodiments, the phase locked loop circuit 112 of the local oscillator 110 can generate the phase locked loop signal PS based on the oscillating frequency of the oscillation crystal CY and the capacitance value of the capacitive element C.

In operation S420, the filter circuit 120 generates the filtered signal FS according to the phase locked loop signal PS. In some embodiments, the filter circuit 120 is implemented by a band-pass filter.

In operation S430, the control circuit 130 adjusts the capacitance value of the capacitive element C (i.e. generating the adjusted capacitance value) according to the filtered signal FS and the phase locked loop signal PS. In some embodiments, when the variations of the environment conditions result in the frequency offset on the oscillation frequency of the oscillation crystal CY, the signal energy of the phase locked loop signal PS inputted into the frequency mixer 132 is barely attenuated but the signal energy of the filtered signal FS is greatly attenuated. In this situation, the direct-current signal DC generated by the frequency mixer 132 cannot have the maximum direct-current voltage, and then the comparator circuit 134 generates the comparison result CR accordingly. Then, the driver circuit 136 can generate the control signal CT1 according to the comparison result CR to adjust the capacitance value of the capacitive element C in the local oscillator 110.

In operation S440, the local oscillator 110 generates the calibrated local oscillation signal OS' according to the oscillating frequency of the oscillation crystal CY and the adjusted capacitance value of the capacitive element C. In some embodiments, the adjusted capacitance value of the capacitive element C can be utilized to calibrate the frequency offset of the phase locked loop signal PS, such that the frequency divider 114 can perform a frequency dividing process on the calibrated phase locked loop signal PS' to generate the calibrated local oscillation signal OS'.

In operation S450, the radio frequency signal generator circuit 140 generates the radio frequency signal RS according to the calibrated local oscillation signal OS' and the baseband signal BS. In some embodiments, the frequency mixer 144 can perform a frequency mixing process on the calibrated local oscillation signal OS' and the baseband signal BS to generate the frequency mixing signal MS. The radio frequency circuit 146 can generate the radio frequency signal RS according to the frequency mixing signal MS.

As described above, the transceiver circuit and the self-calibration method of the present disclosure can calibrate the frequency offsets fast and immediately, and the transceiver circuit and the self-calibration method of the present disclosure are suitable for different transceiver circuits and different oscillation crystals.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transceiver circuit configured to couple an oscillation crystal, wherein the transceiver circuit comprises:
a local oscillator comprising a capacitive element, wherein the local oscillator is configured to generate a phase locked loop signal based on an oscillation frequency of the oscillation crystal and a capacitance value of the capacitive element;
a filter circuit configured to generate a filtered signal according to the phase locked loop signal;
a control circuit configured to adjust the capacitance value to be an adjusted capacitance value according to the filtered signal and the phase locked loop signal, wherein the local oscillator is further configured to generate a calibrated local oscillation signal according to the oscillation frequency and the adjusted capacitance value; and
a radio frequency signal generator circuit configured to generate a radio frequency signal according to the calibrated local oscillation signal and a baseband signal.

2. The transceiver circuit of claim 1, wherein the filter circuit is a band-pass filter.

3. The transceiver circuit of claim 2, wherein the band-pass filter is implemented by a transmission line.

4. The transceiver circuit of claim 1, wherein the control circuit comprises:
a frequency mixer configured to perform a frequency mixing process on the filtered signal and the phase locked loop signal to generate a direct-current signal;
a comparator circuit configured to compare the direct-current signal with a maximum direct-current voltage to generate a comparison result; and
a driver circuit configured to adjust the capacitance value to be the adjusted capacitance value according to the comparison result.

5. The transceiver circuit of claim 4, wherein the capacitive element is corresponding to a plurality of capacitance values, the capacitance values are corresponding to a plurality of direct-current voltages, and the maximum direct-current voltage is a maximum one among the direct-current voltages.

6. The transceiver circuit of claim 1, wherein the local oscillator comprises:
a phase locked loop circuit configured to generate a calibrated phase locked loop signal based on the oscillation frequency and the adjusted capacitance value; and
a frequency divider configured to perform a frequency dividing process on the calibrated phase locked loop signal to generate the calibrated local oscillation signal.

7. The transceiver circuit of claim 1, wherein the radio frequency signal generator circuit comprises:
a baseband circuit configured to generate the baseband signal;
a frequency mixer configured to perform a frequency mixing process on the calibrated local oscillation signal and the baseband signal to generate a frequency mixing signal; and
a radio frequency circuit configured to generate the radio frequency signal according to the frequency mixing signal.

8. The transceiver circuit of claim 1, wherein the capacitive element comprises a switched capacitor array.

9. A self-calibration method, comprising:
generating, by a local oscillator, a phase locked loop signal based on an oscillation frequency of an oscillation crystal and a capacitance value of a capacitive element;
generating, by a filter circuit, a filtered signal according to the phase locked loop signal;
adjusting, by a control circuit, the capacitance value to be an adjusted capacitance value according to the filtered signal and the phase locked loop signal;
generating, by the local oscillator, a calibrated local oscillation signal according to the oscillation frequency and the adjusted capacitance value; and
generating, by a radio frequency signal generator circuit, a radio frequency signal according to the calibrated local oscillation signal and a baseband signal.

10. The self-calibration method of claim 9, wherein the filter circuit is a band-pass filter.

11. The self-calibration method of claim 10, wherein the band-pass filter is implemented by a transmission line.

12. The self-calibration method of claim 9, further comprising:
performing, by a frequency mixer of the control circuit, a frequency mixing process on the filtered signal and the phase locked loop signal to generate a direct-current signal;
comparing, by a comparator circuit of the control circuit, the direct-current signal with a maximum direct-current voltage to generate a comparison result; and
adjusting, by a driver circuit of the control circuit, the capacitance value to be the adjusted capacitance value according to the comparison result.

13. The self-calibration method of claim 12, wherein the capacitive element is corresponding to a plurality of capacitance values, the capacitance values are corresponding to a plurality of direct-current voltages, and the maximum direct-current voltage is a maximum one among the direct-current voltages.

14. The self-calibration method of claim 9, further comprising:
generating, by a phase locked loop circuit of the local oscillator, a calibrated phase locked loop signal based on the oscillation frequency and the adjusted capacitance value; and
performing, by a frequency divider of the local oscillator, a frequency dividing process on the calibrated phase locked loop signal to generate the calibrated local oscillation signal.

15. The self-calibration method of claim 9, further comprising:
generating, by a baseband circuit of the radio frequency signal generator circuit, the baseband signal;
performing, by a frequency mixer of the radio frequency signal generator circuit, a frequency mixing process on the calibrated local oscillation signal and the baseband signal to generate a frequency mixing signal; and
generating, by a radio frequency circuit of the radio frequency signal generator circuit, the radio frequency signal according to the frequency mixing signal.

16. The self-calibration method of claim 9, wherein the capacitive element comprises a switched capacitor array.

* * * * *